United States Patent [19]
Erickson et al.

[11] Patent Number: 5,622,752
[45] Date of Patent: Apr. 22, 1997

[54] METHODS AND SYSTEM FOR APPLYING A UNIFORM COATING TO A MOVING WORKPIECE USING AN ULTRASONIC SPRAY HEAD

[75] Inventors: Stuart Erickson, Marblehead; Drew Erickson, Newburyport, both of Mass.

[73] Assignee: Ultrasonic Systems, Inc., Amesbury, Mass.

[21] Appl. No.: 427,145

[22] Filed: Apr. 24, 1995

[51] Int. Cl.⁶ ................................................. B05D 7/00
[52] U.S. Cl. ........................ 427/421; 427/286; 427/424; 427/600; 118/305; 118/323; 118/324
[58] Field of Search ................................. 427/421, 286, 427/424, 600; 118/305, 323, 324

[56] References Cited

U.S. PATENT DOCUMENTS

| | | | |
|---|---|---|---|
| 2,777,419 | 1/1957 | Paasche | 118/323 |
| 3,184,328 | 5/1965 | Wagner et al. | 118/323 |
| 3,722,468 | 3/1973 | Middleton | 118/323 |
| 4,821,948 | 4/1989 | Fisher et al. | 228/223 |
| 4,871,105 | 10/1989 | Fisher et al. | 228/33 |
| 5,024,856 | 6/1991 | Hohnerlein | 427/256 |
| 5,219,120 | 6/1993 | Ehrenberg et al. | 239/11 |
| 5,460,653 | 10/1995 | Otani et al. | 118/324 |

*Primary Examiner*—Shrive P. Beck
*Assistant Examiner*—David M. Maiorana
*Attorney, Agent, or Firm*—Heslin & Rothenberg, P.C.

[57] ABSTRACT

A printed circuit board ("PCB") is moved on a conveyor towards an ultrasonic spray head ("head") that is mounted below the PCB on a guide rail. The guide rail and the direction of motion of the PCB define an acute angle. When the PCB reaches a predetermined position, the head begins a motion across the PCB, spraying a rectangular swatch of soldering flux. The velocity of the head is controlled such that the swatch of flux is substantially perpendicular to the direction of motion of the PCB. After spraying, the head deactivates and reciprocates back across the PCB such that no flux is sprayed. The cycle repeats after a predetermined delay whereby adjacent swatches of flux do not substantially overlap.

18 Claims, 6 Drawing Sheets

METHODS AND SYSTEM FOR APPLYING A UNIFORM COATING TO A MOVING WORKPIECE USING AN ULTRASONIC SPRAY HEAD

CROSS-REFERENCE TO RELATED APPLICATIONS

This application is related to commonly-assigned application Ser. No. 08/156,314 entitled "Ultrasonic Spray Coating System with Enhanced Spray Control," filed Nov. 22, 1993, which issued as U.S. Pat. No. 5,409,163 on Apr. 25, 1995 and which is expressly incorporated herein by reference in its entirety, and which is itself a continuation-in-part of commonly-assigned application Ser. No. 08/116,015, entitled "Ultrasonic Spray Coating System," filed Sep. 2, 1993 which is itself a continuation-in-part of commonly-assigned application Ser. No. 07/791,412, entitled "Ultrasonic Spray Coating System," filed Nov. 13, 1991, now abandoned, which itself is a continuation-in-part of commonly-assigned application Ser. No. 07/469,937, entitled "Ultrasonic Spray Coating System," filed Jan. 25, 1990, now abandoned.

TECHNICAL FIELD

The present invention relates in general to a system for applying a uniform coating to a workpiece. More specifically, the invention relates to methods and a system for using an ultrasonic spray head to apply a uniform coating to a moving workpiece.

BACKGROUND OF THE INVENTION

The application of uniform coatings to moving workpieces continues to be an important goal of spray coating systems. Although spray coating systems may use many different types of spray heads, ultrasonic spray heads have recently gained considerable attention. In general, ultrasonic spray heads function by converting a film of liquid on a vibrating surface into a mist of small drops. Various techniques for precisely controlling this ultrasonic spray head such that a uniform spray pattern is produced are disclosed in U.S. Pat. No. 5,409,163 entitled "Ultrasonic Spray Coating System with Enhanced Spray Control," which is incorporated by reference hereinabove.

One area in which ultrasonic spray coating systems may be used is the application of soldering flux to printed circuit boards ("PCBs"). As is well known, a wave soldering process is conventionally used to apply solder to a printed circuit board populated with components such that they mechanically and electrically connect to the PCB. A component's electrical lead typically extends through the PCB via a "through hole." Surrounding this through hole on either side of the PCB is a copper pad that is often coated with another conductor (e.g., silver or tin) to facilitate solderability and to protect the copper from corrosion. The interior of the through hole is also conventionally coated with a conductor. As the PCB passes through the wave solder machine its underside encounters a wave of molten solder. This solder bonds to the pads of the circuit board and the leads of the components, flowing up the through hole, thereby mechanically and electrically bonding the component to the PCB.

An applied coating of soldering flux enhances the flow of solder described above. Conventionally, the PCB encountered a flux wave prior to encountering the solder wave. This flux wave comprised a thick rosin flux which was forced up into the through holes by wave forces. Recently, rosin fluxes have been abandoned because the printed circuit boards they are used on require post-soldering cleaning using Chloro-Fluorocarbons ("CFCs") which are known to be environmentally hazardous.

As a replacement for rosin fluxes, "no-clean" fluxes have been used. These typically comprise a volatile organic compound ("VOC") used as a carrier (e.g., alcohol) and a small amount of flux (e.g., 1–5%). The carrier/flux mixture is oversprayed onto a PCB to insure complete coverage. After application of the no-clean flux, a heating of the board causes the VCO and flux to flow into the through holes such that solder flow therethrough is facilitated, and causes the VOC carrier to evaporate, leaving the flux in place. Due to the small amount of flux remaining on the board, no cleaning process is necessary after soldering. However, there are environmental concerns regarding the use of VOCs as carriers.

More recently, attempts at using water as a carrier for "no-clean" fluxes have been made with limited success. Water carried fluxes does not naturally flow across the PCB as well as VOC carried fluxes. Therefore, methods have been employed which severely over apply water carried fluxes to insure complete coverage of, and a uniform distribution over, the PCB. Further, due to the non-uniformity of conventional and ultrasonic spray nozzles, a pattern of overlapping spray is used to guarantee complete and uniform coverage (as well as to insure the over application of flux). However, even by using an over spraying technique, little flux penetrates the through holes.

An example of a conventional spraying mechanism is shown in FIG. 1. A PCB 13 moves along a conveyor 15 towards a solder wave. The PCB 13 is sprayed with a water carried flux by a conventional or ultrasonic nozzle 10 that produces a non-uniform conical spray pattern 16 when active. Nozzle 10 is guided by a rail 17 that is positioned at a right angle 12 to the direction of motion of the workpiece. During spraying, the nozzle 10 is maintained active and continuously reciprocated back and forth along rail 17. Due to right angle 12 of guide rail 17 and the motion of the PCB, a zigzag pattern of spray 14 is produced on the PCB. This spray pattern has significant overlap to compensate for the non-uniformity of the nozzle and to insure over spraying of the board with flux.

Several problems are associated with the conventional over spraying techniques for applying water carried fluxes. The excess water carrier must be evaporated prior to soldering, or poor solder joints may form due to steam being produced upon contact of unevaporated excess water with the molten solder wave. However, water does not evaporate as quickly as VOCs so a longer drying time within a heated environment is necessary for complete evaporation of the water. Furthermore, the conventional deposition of excess flux on the PCB results in a waste of flux, thereby increasing the cost of the soldering process.

Recently, the elimination of the conductive coating from the copper pads and the interior of the through holes has been identified as a cost saving measure in the PCB manufacturing process. An organic coating is applied to the copper pads and through holes, as a replacement for the conductive coating to prevent corrosion of the copper. The flux is required to break down this protective organic coating to expose the copper to the solder and facilitate soldering. With this requirement, the need for flux inside the through holes is substantially increased. However, conventional over spray methods have been unable to force adequate amounts of water carried flux into the through holes without depositing excessive amounts of flux on the bottom surface of the PCB.

The present invention is directed towards solutions to the above noted problems.

SUMMARY OF THE INVENTION

In a first aspect, the present invention comprises a method for applying a uniform coating to a workpiece moving in a first direction in a two-dimensional plane, the first direction comprising a workpiece vector. The method uses an ultrasonic spray head ("head") disposed a predetermined distance from the two-dimensional plane that produces a uniform spray having a predetermined width when active.

The method includes providing a first linear displacement of the head relative to the workpiece while the head is active such that the workpiece receives a uniform rectangular coating of the predetermined width. A head vector projected into the two-dimensional plane defines motion of the head relative to the workpiece vector, wherein the head vector and the workpiece vector define an acute angle.

Thereafter, the spray head is deactivated and a second linear displacement of the head relative to the workpiece is provided while the head is inactive such that no coating is received by the workpiece.

As an enhancement, the second linear displacement may define a return vector that is parallel to and directionally opposite the head vector. More particularly, the first linear displacement step may comprise linearly passing the head across the workpiece, while the second linear displacement step may comprise linearly returning the head across the workpiece.

Further enhancements to the method may include repeating the method steps at least once such that the workpiece receives multiple uniform coatings, each uniform coating having the predetermined width. Moreover, the repeating may be performed on a predetermined periodic basis such that each uniform coating has an adjacent uniform coating to which it has a minimal overlap.

In another aspect, the present invention includes an alternate method for applying a uniform coating to a workpiece. The method includes providing a first linear displacement of the head relative to the workpiece while the head is active such that the workpiece receives a first uniform rectangular coating having the predetermined width. A first head vector projected into the two-dimensional plane defines motion of the head relative to the workpiece vector. Further, the first head vector and the workpiece vector define a first acute angle.

A second linear displacement of the head relative to the workpiece is provided while the head is inactive such that no coating is received by the workpiece. A second head vector projected into the two-dimensional plane defines motion of the head relative to the workpiece vector. Specifically, the second head vector is substantially parallel to and directionally opposite the workpiece vector.

Moreover, a third linear displacement of the head relative to the workpiece is provided while the head is active such that the workpiece receives a second uniform rectangular coating having the predetermined width. A third head vector projected into the two-dimensional plane defines motion of the head relative to the workpiece vector, wherein the third head vector and a vector directionally opposite the workpiece vector define a second acute angle. The first uniform rectangular coating and the second uniform rectangular coating are substantially parallel.

Further enhancements to the methods and a corresponding system are disclosed herein. As an enhancement to these, the ultrasonic spray head may include means for producing high frequency mechanical energy from high frequency electrical energy. Further, a spray forming head is driven by the high frequency mechanical energy produced by the converter means. The spray forming head has an atomizing surface for propelling the spray. A first gas director mounted near the spray projects a first stream of gas in a first gas direction. Specifically, the first stream of gas laterally redistributes the spray propelled from the atomizing surface. A second gas director projects a second stream of gas in a second gas direction, the second gas direction being in opposing relation to the first gas direction such that the second stream of gas cooperates with the first stream of gas to substantially uniformly expand and entrain the gas.

The techniques of the present invention have many advantages and features. By providing a uniform spray in a minimally overlapping manner, the amount of wasted flux is greatly reduced. Further, since a minimal required amount of carrier and flux is deposited, the amount of water that will have to be evaporated before soldering is minimized, simplifying the evaporation process. Moreover, the techniques disclosed herein facilitate the penetration of flux into through holes to facilitate soldering printed circuit boards that have organic coated through holes. Thus, the use of water based fluxes is made possible with a wider variety of PCBs than was heretofore possible.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

BEST MODE FOR CARRYING OUT THE INVENTION

The techniques of the present invention facilitate the application of a uniform coating of a VOC or water carried soldering flux to a printed circuit board ("PCB"). The coating is applied without over spraying such that only a minimal amount of VOC or water carrier requires evaporation prior to soldering. This is facilitated by particular techniques disclosed herein for moving an ultrasonic spray head relative to a PCB. Further, this is made possible by using a rectangular-shaped spray head having a spray pattern with a rectangular-shaped application area on the workpiece surface. Coating distribution and application force are uniform within the application area using the novel rectangular-shaped spray head of the above-incorporated U.S. Pat. No. 5,409,163.

Figure 1:
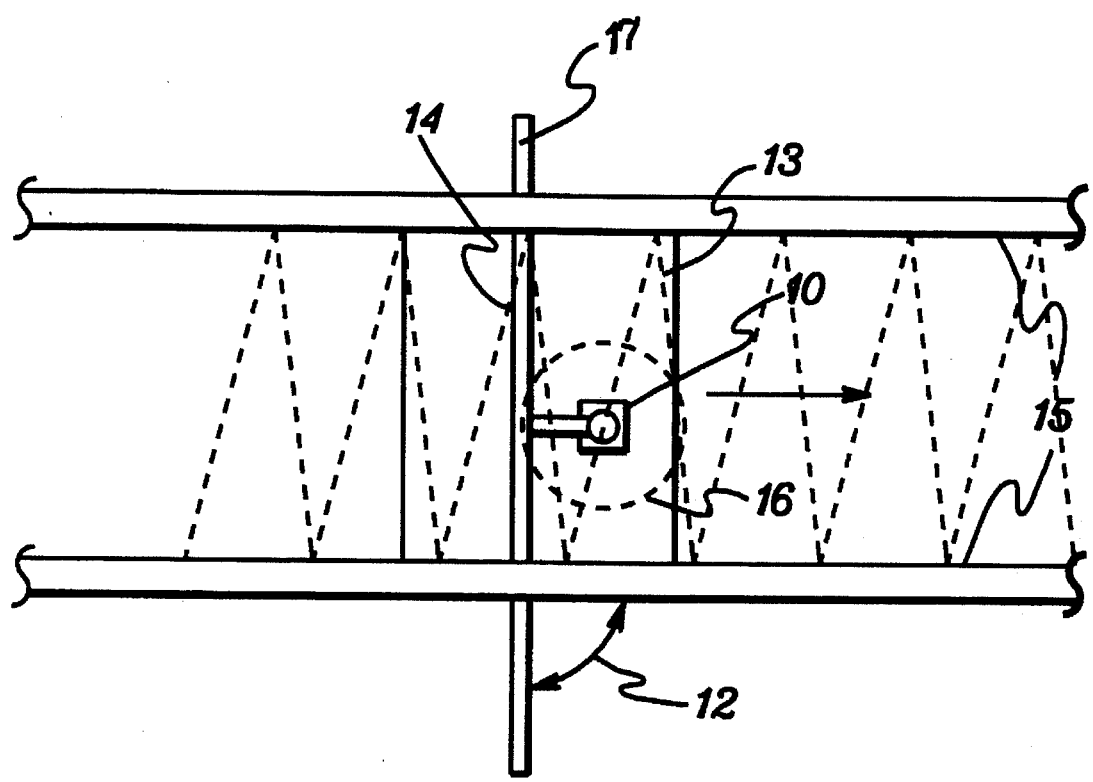
FIG. 1 is a bottom view of a conventional apparatus for spraying flux onto PCBs.
Figure 2:
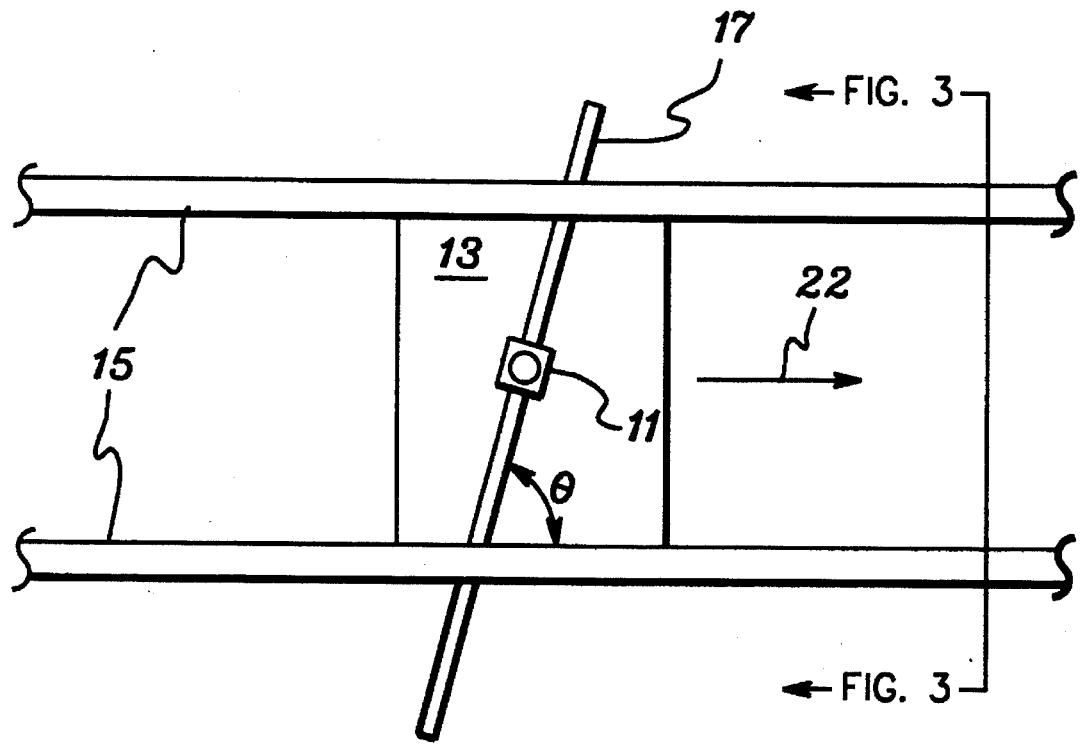
FIGS. 2 and 3 are a bottom view and a front view, respectively, of an apparatus for spraying flux onto PCBs pursuant to one embodiment of the present invention.
Figure 3:
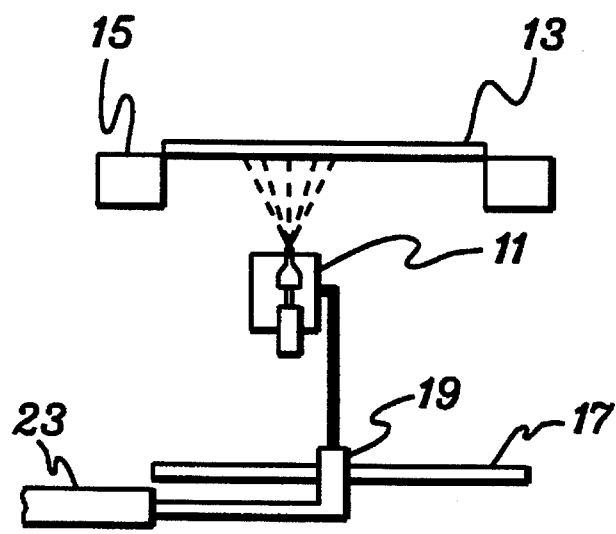

Shown in FIGS. 2 and 3 is an example of an apparatus that uses the techniques of the present invention to spray a uniform coating of a VOC or water carried soldering flux onto a PCB. A PCB 13 is attached to a conveyor 15 that moves the PCB at a constant rate in a first direction 22. An ultrasonic spray head ("head") 11 is mounted to guide rail 17 via a slidable mount 19. Guide rail 17 is disposed at an angle θ in relation to the direction of motion of the PCB. Motion of the head 11 along rail 17 is provided by a pneumatic linear actuator 23. As will be apparent to one of ordinary skill in the art, many other techniques are available for moving the head 11 including, for example, stepper motors. Further, alternate techniques for providing relative motion between head 11 and PCB 13 are possible such as, for example, fixing head 11 and moving PCB 13 within a two-dimensional plane defined thereby.

The ultrasonic spray head 11 used by the techniques of the present invention desirable provides a very uniform, elongated spray pattern. One example of such a head comprises that described in commonly-assigned U.S. Pat. No. 5,409, 163 entitled "Ultrasonic Spray Coating System with Enhanced Spray Control," which is incorporated by reference hereinabove. The techniques discussed hereinbelow provide the appropriate positioning and motion for the ultrasonic spray head such that a uniform coating of solder flux is applied to the PCB with through hole penetration.

As described in greater detail in the above-incorporated U.S. Pat. No. 5,409,163, the present invention employs an ultrasonic spray coating system with spray velocity control. The system produces a coating of liquid of desired uniformity, precision, shape and thickness on a workpiece surface. There is a minimal waste of coating liquid with over 90 percent of the atomized liquid being delivered to the work surface to be coated. Special air directors expand the spray width (uniformly) to a width greater than that of the spray head atomizing surface. Further, control of spray velocity is enhanced to facilitate coating application in various situations, such as the direct deposition of flux within through holes on a printed circuit board.

By design, the spray forming head supports a longitudinal displacement wave in which maximum displacement in the ±z-axis direction, occurs uniformly over the atomizing surface. The atomizing surface is preferably rectangular-shaped. The ultrasonic displacement wave draws or pumps the liquid from the feed blade to the atomizing surface, distributes the liquid into a uniform film over the surface and then transforms the film into droplets that are propelled from the surface in the (positive) +z-axis direction. The flow rate range (or atomization rate) for a particular liquid is directly proportional to the amplitude of the displacement wave on the atomizing surface. The quality of the resulting spray pattern is directly related to the uniformity of the displacement wave on the atomizing surface. Since the spray forming head is preferably rectangular-shaped, the resultant spray pattern is rectilinear-shaped and uniform within the application area on a workpiece surface. Further, because of the spray head design, there is a uniform spray application force applied within the dimensions of the rectilinear-shaped spray pattern.

As an enhancement, a primary gas director and an auxiliary gas director can be provided to define a gas entrainment mechanism which is employed to control (enhance) the pattern and velocity of spray projecting from the atomizing surface of the spray forming tip. Further, this gas entrainment mechanism can be employed to expand the area of the work surface undergoing a coating operation.

The ultrasonic spray head 11 is disposed beneath the printed circuit board 13 (FIG. 3). This enables the flux to be applied while the PCB is on the same conveyor 15 used for transferring the board through the solder wave. The solder wave contacts the underside of the PCB after the flux is applied thereto.

According to the techniques of the present invention, the ultrasonic spray head is positioned at a predetermined distance away from the PCB. The spray produced by the head will have a particular width at the predetermined distance. Thus, so long as guide rail 17 along which the head moves is parallel to the plane of the conveyor, the head will always be the same distance from the PCB and the width of the spray will be constant.

The distance of the spray head from the PCB and the uniform spray application force contribute to the penetration of the VOC or water carried flux into the through holes of the PCB. It has been found by experimentation that there must be sufficient closeness of the head to the PCB to enable penetration into the through holes. This would be a distance at which the momentum of the sprayed drops will still have adequate momentum to penetrate the through holes. As one example, head 11 is positioned approximately 3 inches away from the PCB which results in a spray pattern 6 inches wide that has sufficient momentum to adequately penetrate the through holes of the PCB.

As a general note, a Programmable Logic Controller ("PLC") is used to control the motion of the spraying system. The PLC is attached to various sensors which detect, for example, the speed of the conveyor, the position of the leading and trailing edges of the PCB, and the position of the spray head. The PLC also controls the speed and direction of the spray head by controlling the speed and direction of actuator 23. The individual steps of programming and using PLCs will be apparent to one of ordinary skill in the art.

Figure 4:
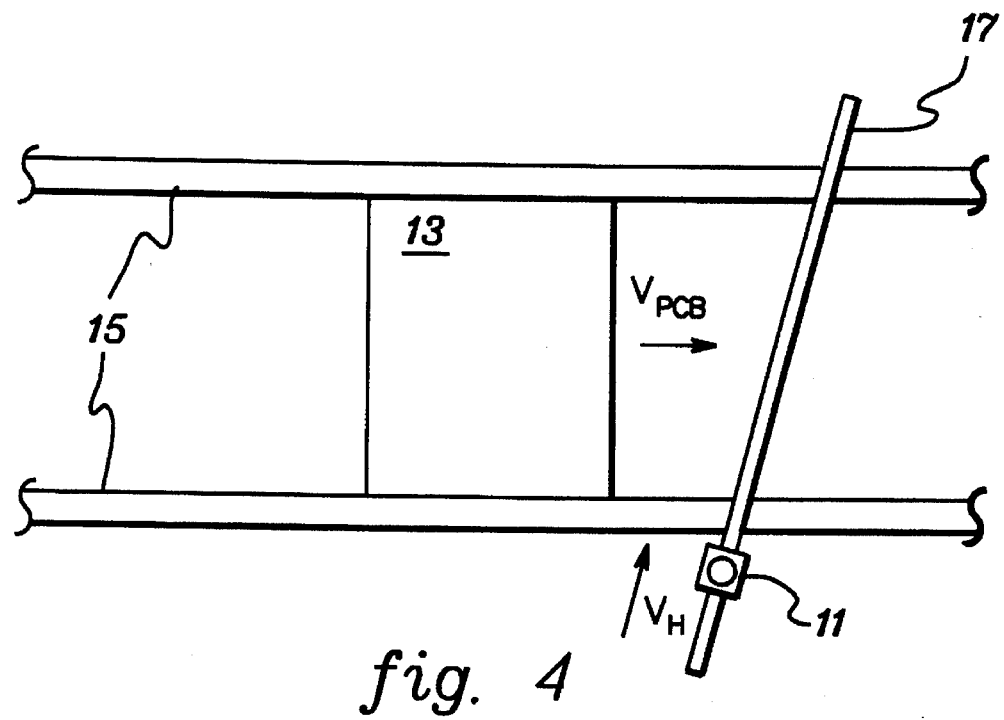
FIGS. 4, 5, 6, 7, and 8 are bottom views of the apparatus of FIGS. 2 and 3 during various stages of spraying according to an embodiment of the present invention.
Figure 5:
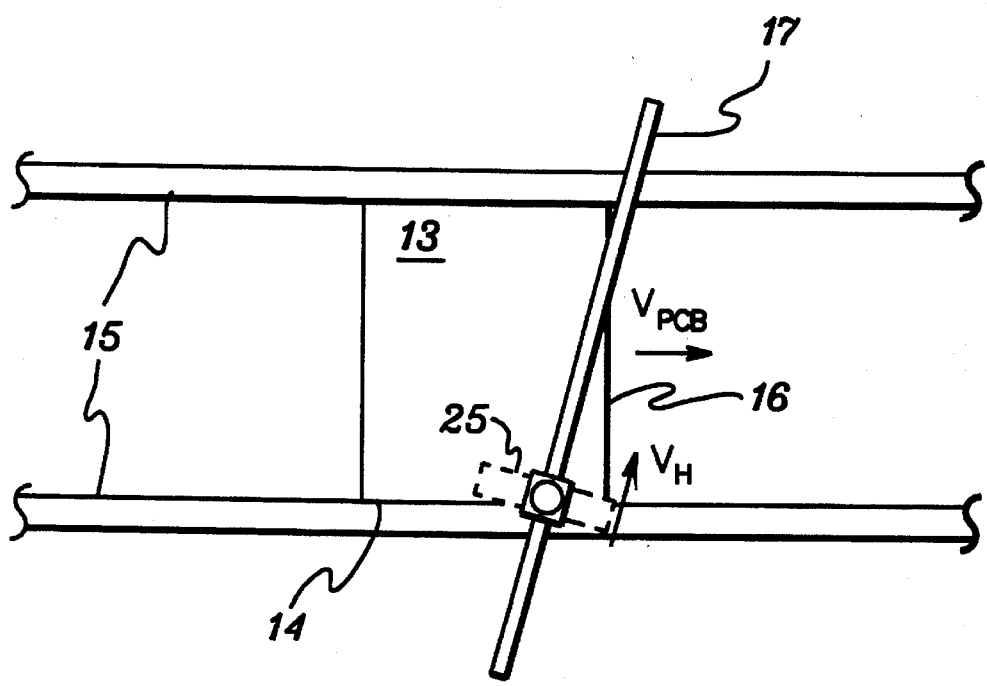

The techniques of the present invention begin with a PCB 13 moving down a conveyor at a velocity $V_{PCB}$ and approaching an inactive ultrasonic spray head 11 (FIG. 4). When the PCB 13 reaches a predetermined position that is detected by the PLC, the head 11 begins moving along the guide rail 17 in a direction 28 at a velocity $V_H$ (FIG. 5). When the spray head reaches a first edge 14 of PCB 13, the spray head is activated, producing a spray pattern 25. The motion of the head is particularly timed in conjunction with PCB sensors such that when head 11 reaches first edge 14 of PCB 13 and is activated, spray will not substantially exceed a leading edge 16 of the PCB. Thus, flux is only emitted when head 11 is aligned over PCB 13, eliminating wasted flux.

Figure 6:
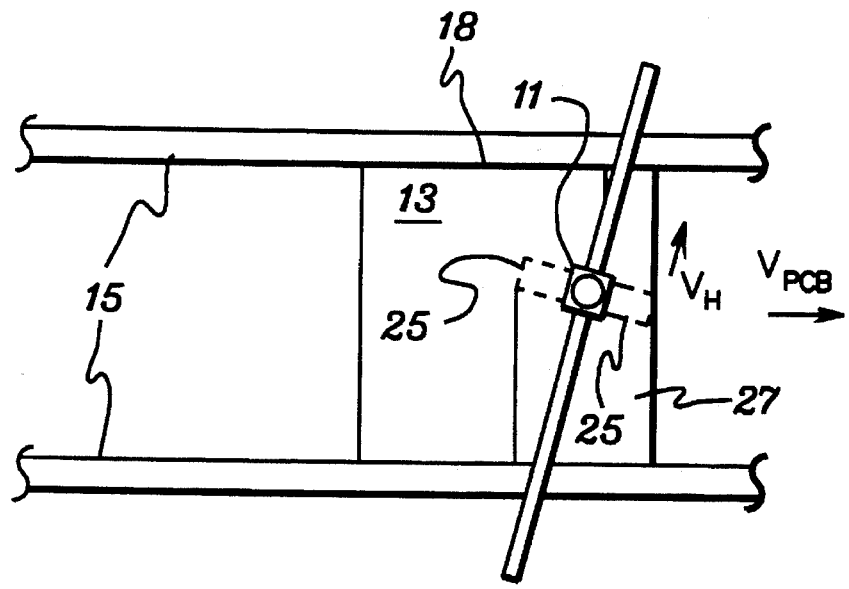
Figure 7:
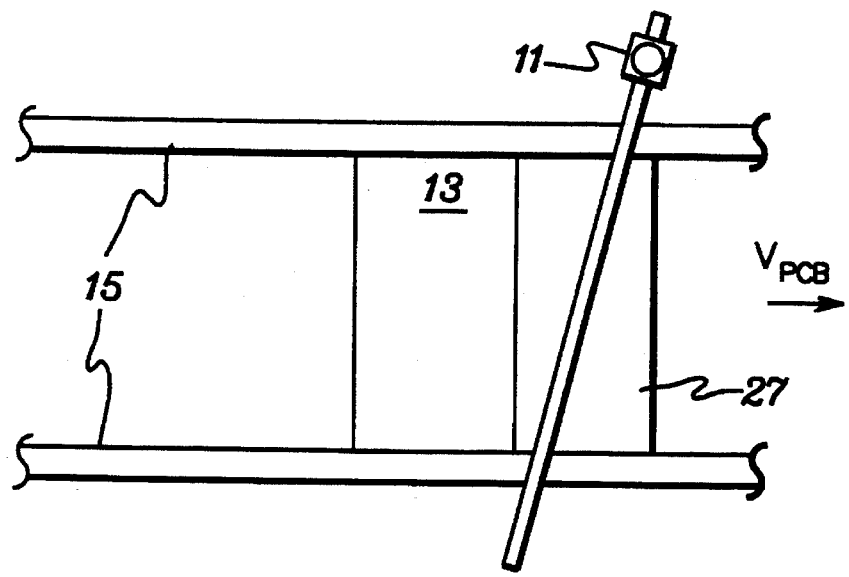

Head 11 continues to move at velocity $V_H$ as the PCB continues along the conveyor (FIG. 6). Because head 11 is active while over PCB 13, a rectangular segment 27 of flux is deposited. It is observable that segment 27 is oriented perpendicular to the direction of motion of the PCB (and the PCB itself). This results from a precise control of $V_H$ in relation to $V_{PCB}$ and angle θ as will be discussed in detail below. As the head passes a second edge 18 of PCB 13, a PLC sensor is tripped and head 11 deactivates so as to minimize waste of flux (FIG. 7). A completed rectangular segment of flux 27 is therefore deposited on printed circuit board 13.

Figure 8:
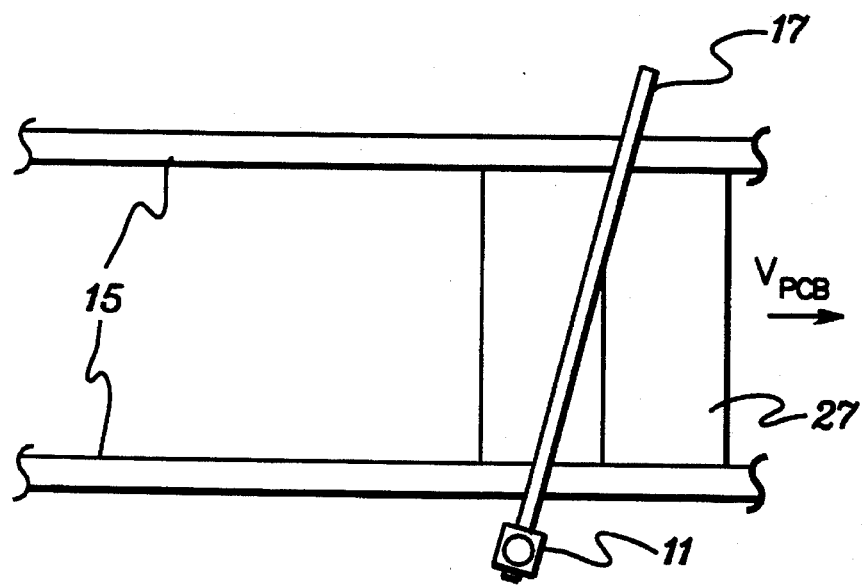

To continue, head 11 remains inactive and returns to its home position along rail 17 (FIG. 8). The return velocity will generally be greater than the velocity ($V_H$) used while spraying to enable head 11 to reach home position before the next segment is to be sprayed. Once in home position, motion of the head 11 is suspended until the PCB advances approximately the width of swatch 27. Thus, when head 11 begins another spray cycle, there will be minimal overlap between swatches. Of course, the precise amount of overlap can be controlled by varying the amount of time between spray cycles. For example, if a segment is 6 inches (0.5 ft.) wide, $V_{PCB}$=5 feet-per-minute ("fpm") and no overlap is desired, then the time between spray cycles will be (0.5 feet/5 fpm) or 0.1 minutes (6 seconds).

Figure 9:
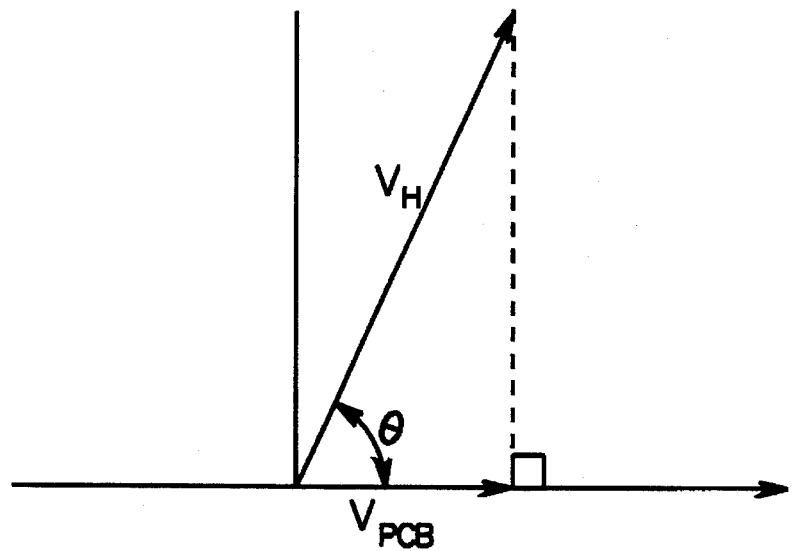
FIG. 9 is a vector diagram of the velocity components of the PCB and ultrasonic spray head pursuant to an embodiment of the present invention.

FIG. 9 is a vector diagram of the relative motion of head 11 to PCB 13 as projected into the two-dimensional plane of PCB 13. The acute angle θ of the direction of head motion ($V_H$) to the direction of PCB motion ($V_{PCB}$) will result in the head having a velocity component in a direction parallel to the direction of motion of the PCB and a velocity component perpendicular thereto. By precisely controlling $V_H$ as a function of $V_{PCB}$ and θ, the component of $V_H$ parallel to the motion of the PCB can be made to equal $V_{PCB}$. This facilitates swatches 27 (FIG. 7) that are perpendicular to the direction of motion of the PCB.

Trigonometry may be used to derive the exact relationship between $V_{PCB}$, $V_H$ and θ (FIG. 9) as follows:

$$\cos θ = (V_{PCB}/V_H).$$

Since $V_{PCB}$ and θ are generally constant, solving for $V_H$ results in the following function:

$$V_H = V_{PCB}/\cos θ$$

As an example, if $V_{PCB}$=5 feet-per-minute ("fpm"), and θ=85 degrees, then:

$$V_H = 5 \; fpm/\cos 85 \; degrees$$

$$V_H = (5/0.0872) \; fpm$$

$$V_H = 57.3 \; fpm = 57.3 \; fpm/60 \; sec\text{-}per\text{-}min$$

$$V_H = 0.9550 \; feet\text{-}per\text{-}second \; (\text{"}fps\text{"}), * 12 \; in\text{-}foot$$

$$V_H = 11.4 \; inches\text{-}per\text{-}second$$

Of course, adjustments to these calculations and the appropriate system parameters can be made to facilitate non-perpendicular orientations of the segments to the direction of motion of the PCB.

Figure 10:
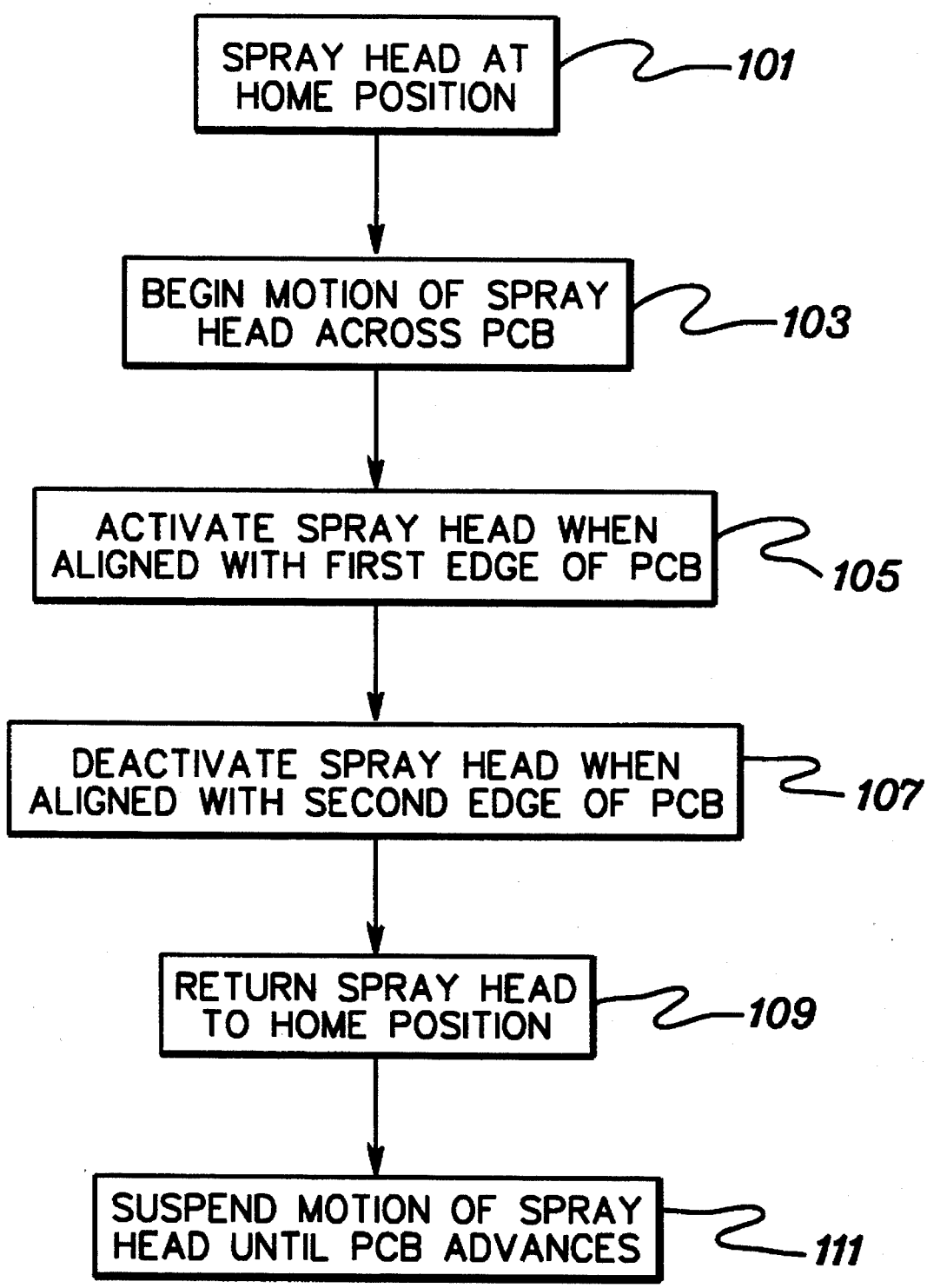
FIG. 10 is a flow diagram of a method for spraying a PCB in conformance with one embodiment of the present invention.

As discussed in detail hereinabove, the techniques of the present invention facilitate the application of VOC or water carried solder flux to a printed circuit board. To briefly summarize (FIG. 10), the spray head rests at a home position until the PCB reaches a designated position in relation to it (101). The spray head then linearly advances towards the PCB along a guide rail (103). As the head advances, it activates when it is aligned with a first edge of the PCB (105) and deactivates when it is aligned with a second edge of the PCB (107). Thereafter, the spray head return to home position (109) and waits a predetermined time, as the PCB advances, to begin the next spray cycle (111).

Several variations on the techniques of the present invention are possible. As described above, the spray head only sprays when moving is one direction along the guide rail such that the swatches of flux are parallel to each other. In an alternate embodiment, spraying can be performed in two directions.

Figure 11:
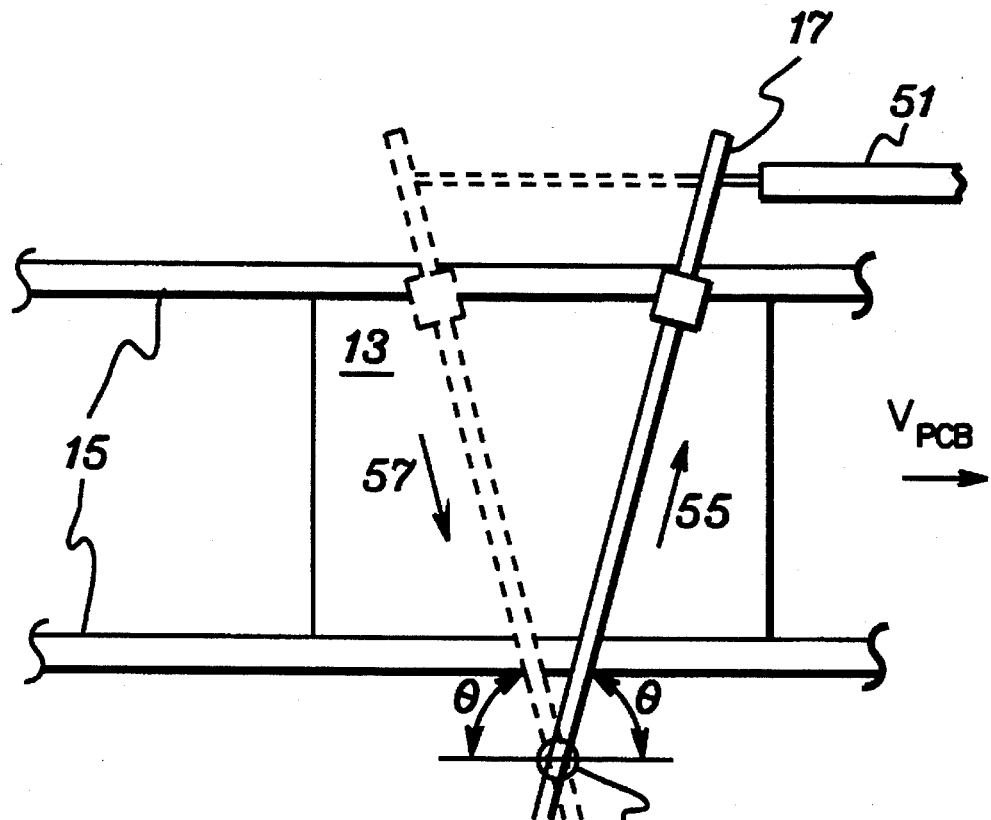
FIG. 11 is a bottom view of an apparatus for spraying flux onto PCBs in accordance with an alternate embodiment of the present invention.

In order to maintain swatches that are parallel to each other, and perpendicular to the direction of motion of the PCB, the acute angle θ of guide rail 17 to the direction of motion of the PCB must be reversed. Accordingly, an apparatus (FIG. 11) is provided with a mechanism for reversing the position of guide rail 17. The guide rail is mounted on a pivot 53 to facilitate its reorientation by linear actuator 51. Specifically, the guide rail is actuatable between the position discussed hereinabove for spraying in a forward direction 55, and is positionable in a complementary manner for spraying in the reverse direction 57. As the spray head reaches the end of its primary (forward) motion, actuator 51 reorients guide rail 17 such that it forms angle θ with a directional vector opposite that of the motion of the PCB. The head 11 then remains motionless until the PCB advances sufficient distance to minimize overlap, and then returns to home position while spraying the PCB. The velocity of the head will be the same for both directions of spraying.

Alternatively, the angle θ of the return motion rail position may vary from the angle θ of the forward motion rail position. In such a case, the velocity of the returning head may be varied such that the swatches are parallel to each other. The calculation of such velocities will be apparent to one of ordinary skill in the art based upon the preceding discussions herein.

To summarize, the techniques of the present invention have many advantages and features. By providing a uniform spray in a minimally overlapping manner, the amount of wasted flux is greatly reduced. Further, since a minimal required amount of carrier and flux is deposited, the amount of VOC or water that will have to be evaporated before soldering is minimized, thereby simplifying the evaporation process. Further, techniques disclosed herein facilitate the penetration of flux into uncoated through holes of PCBs with adequate force to facilitate soldering. Thus, the use of water based fluxes is made possible with a wider variety of PCBs than was heretofore possible.

The techniques of the present invention provide a method for precisely applying a coating to a moving workpiece. Although these techniques are described herein with respect to applying VOC or water carried solder fluxes to PCBs, these techniques may be extended to the application of other coatings to other workpieces. For example, the application of conformal protective coatings to printed circuit boards, or even to the application of varnish to furniture.

While the invention has been described in detail herein in accordance with certain preferred embodiments thereof, many modifications and changes therein may be effected by those skilled in the art. Accordingly, it is intended by the following claims to cover all such modifications and changes as fall within the true spirit and scope of the invention.

We claim:

1. A method for applying a uniform coating to a workpiece moving in a first direction in a two-dimensional plane, said first direction comprising a workpiece vector, said method comprising the steps of:

(a) employing an ultrasonic spray head ("head") disposed a predetermined distance from said two-dimensional plane to produce a uniform spray having a rectilinear shape with a predetermined width wherein the uniform spray has a uniform distribution and a uniform application force across the predetermined width when the ultrasonic spray head is active;

(b) providing a first linear displacement of said head relative to said workpiece while said head is active such that said workpiece receives a uniform rectangular-shaped coating of said predetermined width, wherein a head vector projected into said two-dimensional plane defines motion of said head relative to said workpiece vector, said head vector and said workpiece vector defining an acute angle;

(c) deactivating said ultrasonic spray head; and (d) providing a second linear displacement of said head relative to said workpiece while said ultrasonic spray head is inactive such that no coating is received by said workpiece.

2. The method of claim 1, wherein said providing step (d) comprises providing said second linear displacement such that said second linear displacement defines a return vector that is parallel to and directionally opposite said head vector.

3. The method of claim 2, further comprising repeating said steps (b), (c) and (d) at least once such that said workpiece receives multiple uniform coatings, each uniform coating having said predetermined width, wherein said multiple uniform coatings are non-overlapping.

4. The method of claim 1, wherein said method comprises repeating steps (b), (c) and (d) on a predetermined periodic basis such that each uniform coating of said multiple uniform coatings has an adjacent uniform coating, each uniform coating being non-overlapping with said adjacent uniform coating.

5. The method of claim 4, wherein said method further comprises suspending activation of said head until said workpiece moves, in said first direction relative to said head, substantially said predetermined width.

6. The method of claim 4, wherein said providing step (b) comprises linearly passing said head across said workpiece, and wherein said providing step (d) comprises linearly returning said head across said workpiece.

7. The method of claim 6, wherein said workpiece moves at a workpiece velocity ("$V_W$"), and wherein said providing step (b) comprises linearly passing said ultrasonic spray head at a head velocity ("$V_H$") that is a function of said acute angle and said $V_W$ such that said uniform coating having said predetermined width is oriented substantially perpendicular to said workpiece vector.

8. The method of claim 7, wherein said acute angle is designated θ, and wherein said providing step (b) comprises linearly passing said head across said workpiece such that $V_H = V_W/\cos θ$.

9. The method of claim 6, wherein said providing step (b) comprises linearly passing said head at a head velocity ("$V_H$"), and wherein said linearly returning step (d) comprises linearly returning said head at a return velocity ("$V_R$"), wherein $V_R > V_H$.

10. The method of claim 1, wherein said workpiece comprises a first edge and a second edge, said first edge and said second edge being opposite edges of said workpiece, wherein said method comprises activating said head during said providing step (b) only while a projection of said head into said two-dimensional plane is positioned between said first edge and said second edge.

11. The method of claim 1, wherein said workpiece comprises a printed circuit board, and wherein said providing step (b) further comprises activating said spray head to spray a uniform coating of one of a VOC and a water carried soldering flux onto said printed circuit board.

12. The method of claim 1, wherein said ultrasonic spray head comprises:

converter means for producing high frequency mechanical energy from high frequency electrical energy;

a spray forming head driven by said high frequency mechanical energy produced by said converter means, said spray forming head having an atomizing surface for propelling said spray;

a first gas director mounted near said spray forming head, said first gas director for projecting a first stream of gas in a first gas direction, said first stream of gas laterally redistributing said spray propelled from said atomizing surface;

a second gas director for projecting a second stream of gas in a second gas direction, said second gas direction being in opposing relation to said first gas direction such that said second stream of gas cooperates with said first stream of gas to substantially uniformly expand and entrain said spray; and wherein said providing step (b) further comprises activating said first gas director and said second gas director of said head to spray said uniform coating having said predetermined width on said workpiece.

13. A method for applying a uniform coating to a workpiece moving in a first direction in a two-dimensional plane, said first direction comprising a workpiece vector, said method comprising the steps of:

(a) employing an ultrasonic spray head ("head") disposed a predetermined distance from said two-dimensional plane to produce a uniform spray having a rectilinear shape with a predetermined width wherein the uniform spray has a uniform distribution and a uniform application force across the predetermined width when the ultrasonic spray head is active;

(b) providing a first linear displacement of said head relative to said workpiece while said head is active such that said workpiece receives a first uniform rectangular-shaped coating having said predetermined width, wherein a first head vector projected into said two-dimensional plane defines motion of said head relative to said workpiece vector, said first head vector and said workpiece vector defining a first acute angle;

(c) providing a second linear displacement of said head relative to said workpiece while said head is inactive such that no coating is received by said workpiece, wherein a second head vector projected into said two-dimensional plane defines motion of said head relative to said workpiece vector, said second head vector being substantially parallel to and directionally opposite said workpiece vector; and (d) providing a third linear displacement of said head relative to said workpiece while said head is active such that said workpiece receives a second uniform rectangular-shaped coating having said predetermined width, wherein a third head vector projected into said two-dimensional plane defines motion of said head relative to said workpiece vector, said third head vector and a vector directionally opposite said workpiece vector defining a second acute angle, wherein said first uniform rectangular-shaped coating and said second uniform rectangular-shaped coating are substantially parallel, non-overlapping and abutting on said workpiece.

14. A system for applying a uniform coating to a workpiece moving in a first direction in a two dimensional plane, said first direction comprising a workpiece vector, said system comprising:

an ultrasonic spray head ("head") disposed a predetermined distance from said two-dimensional plane and producing a spray having a rectilinear-shaped pattern with a predetermined width at said predetermined distance when active, said spray further having a uniform distribution and a uniform application force within the rectilinear-shaped pattern at said predetermined distance;

first means for providing a first linear displacement of said head relative to said workpiece while said head is active such that said workpiece receives a uniform rectangular-shaped coating having said predetermined width, wherein a head vector defines motion of said head relative to said workpiece vector, said head vector as projected into said two-dimensional plane and said workpiece vector defining an acute angle;

means for deactivating said ultrasonic spray head; and second means for providing a second linear displacement of said head relative to said workpiece while said ultrasonic spray head is inactive such that no coating is received by said workpiece.

15. The system of claim 14, wherein said ultrasonic spray head comprises:

converter means for producing high frequency mechanical energy from high frequency electrical energy;

a spray forming head driven by said high frequency mechanical energy produced by said converter means, said spray forming head having an atomizing surface for propelling said spray;

a first gas director mounted near said spray forming head, said first gas director for projecting a first stream of gas in a first gas direction, said first stream of gas laterally redistributing said spray propelled from said atomizing surface; and a second gas director for projecting a second stream of gas in a second gas direction, said second stream of gas direction being in opposing relation to said first gas direction such that said second stream of gas cooperates with said first stream of gas to substantially uniformly expand and entrain said gas.

16. The system of claim 15, wherein said workpiece comprises a printed circuit board.

17. The system of claim 16, wherein said uniform spray comprises a uniform spray of a water carried soldering flux.

18. The system of claim 17, wherein said acute angle is in a range of 75 to 90 degrees.

* * * * *